United States Patent [19]

Desmond et al.

[11] 3,742,599

[45] July 3, 1973

[54] PROCESSES FOR THE FABRICATION OF PROTECTED SEMICONDUCTOR DEVICES

[75] Inventors: Richard J. Desmond, North Syracuse; Paul W. Koenig, Clyde, both of N.Y.

[73] Assignee: General Electric Company, Syracuse, N.Y.

[22] Filed: Dec. 14, 1970

[21] Appl. No.: 97,693

Related U.S. Application Data

[62] Division of Ser. No. 782,183, Dec. 9, 1968.

[52] U.S. Cl. .................................... 29/588, 29/589

[51] Int. Cl. .............................................. B01j 17/00

[58] Field of Search ........................... 29/588, 576 S

[56] References Cited

UNITED STATES PATENTS

| | | | |
|---|---|---|---|
| 3,278,813 | 10/1966 | Fahey | 29/588 |
| 3,283,224 | 11/1966 | Erkan | 29/588 |
| 3,478,420 | 11/1969 | Grimes et al. | 29/588 |
| 3,574,815 | 4/1971 | Segerson | 29/588 |

*Primary Examiner*—Charles W. Lanham
*Assistant Examiner*—W. Tupman
*Attorney*—Robert J. Mooney, Nathan J. Cornfeld, Carl O. Thomas, Frank L. Neuhauser, Oscar B. Waddell and Joseph B. Forman

[57] ABSTRACT

A foot portion is bent up from a planar, electrically conductive heat sink, and a header rigidly mounting circular cross-section electrical leads positions one of the leads in engagement with the foot portion. A semiconductor crystal is attached to the heat sink with a soft solder and a contact having an upstanding flange is similarly attached to the semiconductor crystal with a soft solder. The flange is attached to an electrical lead positioned by the header. A pliant, substantially fluid impervious material, such as silicone rubber, is cured around the semiconductor crystal and a casement is then molded to the leads and heat sink to form a shock and strain resistant semiconductive device. The header is in one form enclosed by the casement, but in alternate forms may be partially or entirely stripped after molding.

2 Claims, 15 Drawing Figures

INVENTORS:
RICHARD J. DESMOND,
PAUL W. KOENIG,

BY Carl O. Thomas
THEIR ATTORNEY.

INVENTORS:
RICHARD J. DESMOND,
PAUL W. KOENIG,

BY Carl O. Thomas
THEIR ATTORNEY.

INVENTORS:
RICHARD J. DESMOND,
PAUL W. KOENIG,

BY

THEIR ATTORNEY.

PROCESSES FOR THE FABRICATION OF PROTECTED SEMICONDUCTOR DEVICES

The invention relates to the fabrication of semiconductor devices of such form as to protect semiconductor crystal portions from surface contamination, stress, and shock. This application is a division of our copending, commonly assigned application Ser. No. 782,183, filed Dec. 9, 1968.

Semiconductor devices are frequently fabricated by mounting several semiconductive crystals or pellets in spaced relation on a metallic strip which is to serve as the electrical connection to one of the functionally significant regions of each pellet. The strip may also serve as the heat sink for each device. The strip may be provided with internally stamped out areas defining additional leads for electrical interconnection to remaining functionally significant regions of the pellets. To hold the leads in alignment with the strip the outer extremities of the leads initially remain integral with the strip. In an alternate approach two strips are employed, one of which holds the heat sinks in spaced relation and the remaining holding the leads in spaced relation. In such instance it is, of course, necessary to carefully and accurately align the two strips. In such devices the assemblage, including the pellet and at least a portion of the electrical connectors thereto, is encapsulated or potted in a suitable electrically insulative material such as an epoxy resin from which the outer portion of the electrical leads and/or heat sink extend. The portion of the metallic strip or strips acting merely to space the elements of the devices is then severed from the integral lead and heat sink portions.

The pellets incorporated in the semiconductor devices are quite thin and fragile. They can be damaged by shock or stress applied to the metallic strips during fabrication of the devices, particularly where it is intended to stamp out leads or other portions after assembly. Fracture of the pellets may also occur during use as a result of differentials in the thermal expansion characteristics of the pellets and the leads and heat sinks attached thereto. This problem is accentuated in high current devices where large areal portions of the pellets are mated to contacts. Additionally, the pellets may become contaminated by moisture or air reaching their edges and causing chemical degradation in the junction regions. This may occur even despite surface passivation treatments and the use of a molded casement.

While the stamping of leads from sheet stock has proven advantageous from the standpoint of accurately aligning the leads, particularly where leads are stamped from the same strip as the heat sinks, the rectangular cross-sectional configuration of the leads introduces a number of disadvantages. One distinct disadvantage is the difficulty in fitting mold members around square or rectangular leads. In order to have the leads mate with the mold members it is frequently necessary to allow sufficient clearance that excessive flash is formed in casement molding. This requires a subsequent lancing operation for flash removal. Additionally, square or rectangular leads can be somewhat difficult to use with conventional circuit boards, since these boards can only be provided with rectangular holes at extra expense and even if rectangular holes are provided, the leads must be angularly aligned with the holes during assembly. Still another disadvantage associated with rectangular leads is that they form stress points in the casements molded around them at their corners. It has been observed that fractures in casements in the majority of instances originate at the corners of rectangular leads.

It is an object to provide a process for efficiently fabricating a shock and stress resistant semiconductor device that is fluid impervious.

In one aspect the invention is directed to a process of fabricating a semiconductor device in which a mounting means is removably associated with lead means for a semiconductor device. An extending portion of at least one lead means is mated with a conforming surface of an electrically conductive heat sink. A low impedance electrical interconnection of the mated lead means and heat sink is provided. Semiconductive crystal means are attached to the heat sink in electrically conductive relation therewith. A connecting means is attached to a surface of the semiconductor crystal means remote from the heat sink and to one of the lead means isolated from the heat sink. A pliant, substantially fluid impervious material is placed about the semiconductor crystal means. A casement is molded about the semiconductor means, heat sink, and lead means, and at least a portion of the mounting means is separated from the lead means.

The invention may be better understood by reference to the following detailed description considered in conjunction with the drawings, in which FIG. 1 is an exploded isometric view of a semiconductor device at the stage of fabrication of joining the header;

Figure 1:
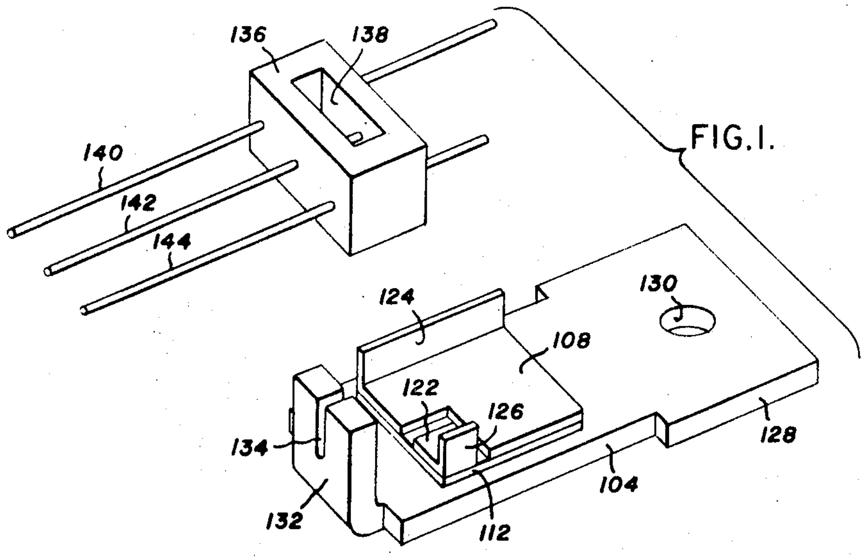
Figure 2:
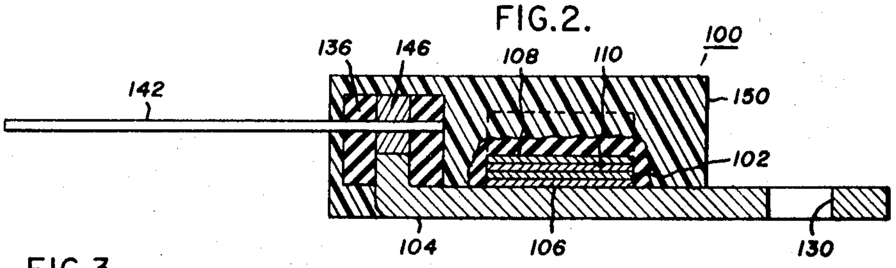
FIG. 2 is a vertical section of the semiconductor device of FIG. 1 when in the fully assembled state.
Figures 3, 15:
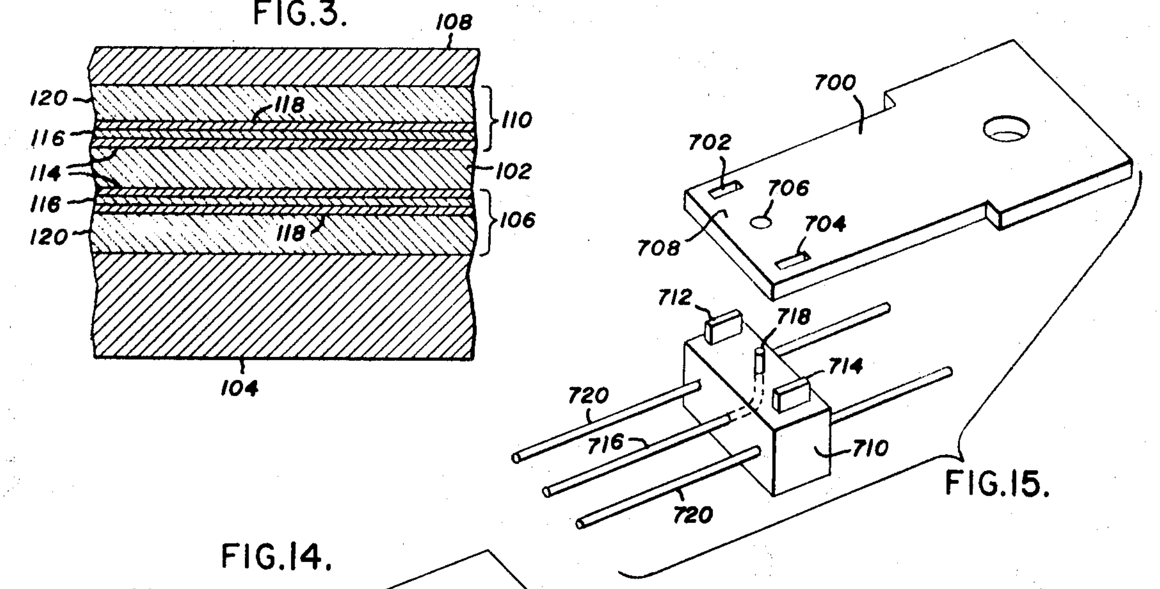
FIG. 3 is a sectional detail of a contact element, first solder layer, first contact system, semiconductive pellet, second contact system, second solder layer, and heat sink.
FIG. 15 is an isometric view of another alternate header and heat sink combination.

A semiconductor device 100 is shown in FIG. 2 in vertical section. A semiconductive element or pellet 102 is joined to an electrically conductive heat sink 104 by a bonding assembly 106 and to an electrical connector 108 by a bonding assembly 110. In FIG. 1 the bonding assemblies and semiconductive element are for simplicity of illustration shown as a semiconductive assembly 112. In FIG. 3 a preferred form of the bonding assemblies 106 and 110 is shown. Each bonding assembly is comprised of a chromium layer 114 bonded directly to the surface of the semiconductive element. A layer of nickel 116 is bonded directly to the chromium layer and a layer 118 of silver overlies to nickel layer to protect the nickel layer against oxidation and to aid in bonding. Each bonding assembly also includes a shock absorbing layer 120 preferably formed of a soft solder. For purposes of description the term "soft solder" is used to define solders having a modulus of elasticity under ambient conditions of less than $11 \times 10^{16}$ lbs/in$^2$. Such solders are sufficiently pliant to accommodate without fracturing shocks in handling and differentials in thermal expansion rates of adhered surfaces. It is preferred to utilize those soft solders capable of alloying in the molten state with silver, including such alloys as lead-tin, lead-tin-indium, lead-tin-silver, lead-antimony, etc. Typically suitable soft solders are comprised of a major proportion of lead and/or tin and a minor proportion of silver. A specific preferred soft solder consists essentially of, on a weight basis, 90 percent lead, 5 percent indium, and the balance silver. Some or all of the silver content of the solder may be derived from the silver layer of the contact system. It is anticipated that the silver layer of the contact system may be completely alloyed with the solder in assembly so that no separate silver layer remains, although a better bond is obtained with a separate silver layer. The chrominum layer is chosen because of its tenacious bond to both P and N type conductivity semiconductive materials. Molybdenum and tungsten layers may be used in place of chromium layers. The nickel layer is bonded to the chromium, tungsten, or molybdenum layer to improve the strength of the bond that may be achieved to the silver layer and the shock absorbing layer. The silver layer is applied to the nickel layer immediately after it is formed to avoid the formation of a thin oxide film thereon, as readily occurs when nickel is exposed to the atmosphere or other oxygen containing environment. Silver is chosen as the protective layer, since it readily alloys with many widely used soft solders. The preferred forms of the bonding assemblies are more fully discussed in Frank et al. copending patent application Ser. No. 782,084, filed Dec. 9, 1968, now abandoned, titled Novel Contact System for High Current Semiconductor Devices, the disclosure of which is here incorporated by reference. Instead of the preferred bonding assembly any conventional bonding assembly may be used, including the use of tungsten or molybdenum back up plates instead of the soft solder layers to act as shock absorbing members. Hard solders may also be used in combination with the back up plates, and other metal contact layers and contact layer sequences may be bonded to the semiconductive elements, but with somewhat less protection of thermally induced stress being transmitted from the heat sink or electrical connector to the semiconductive element.

Referring to FIG. 1, a gate connector 122 is shown attached to the semiconductive assembly 112 in laterally spaced relation to the electrical connector 108. The connector 108 is provided with an upstanding flange portion 124, and the gate connector is provided with a similar upstanding flange portion 126. The heat sink is provided with a laterally extending tab portion 128 having a centrally located aperture 130 to facilitate thermal engagement of the heat sink with a structure capable of receiving and dissipating heat, such as a chassis or a heat fin array. Along an opposite edge of the heat sink an upstanding foot portion 132 is integrally joined. As shown, the foot portion initially lies in the plane of the heat sink and is bent to a perpendicular orientation. The upper edge of the foot portion is provided with a groove 134.

A rigid insulative header 136 is provided with a central window 138 which is sized to slidably fit over the foot portion of the heat sink. The header carries three circular spaced parallel leads 140, 142, and 144. Leads 140 and 144 pass through the header without intersecting the window 138, but tangentially engage upstanding flanges 124 and 126 of the connector 108 and the gate connector. The leads are preferably soldered or otherwise bonded to the upstanding flanges along their length to assure a low resistance electrical interconnection. The lead 142 is slidably fitted into the groove 134 in the foot portion of the heat sink and is soldered thereto at 146. It can be seen that the lead 140 is electrically conductively associated with the electrical connector 108 which is in turn bonded to one terminal of the semiconductive assembly, the lead 142 is electrically conductively associated with the heat sink, which is in turn bonded to a remaining terminal of the semiconductive assembly, and the lead 144 is electrically conductively associated with the gate connector 122, which is bonded to a gate region of the semiconductive assembly.

Figure 4:
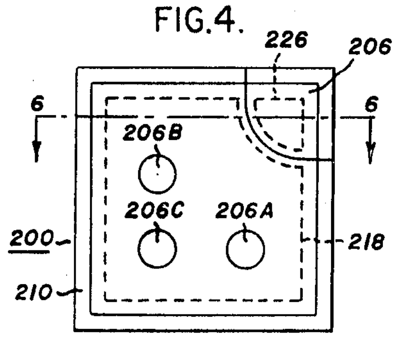
FIG. 4 is a plan view of a gate controlled thyristor pellet.
Figure 5:
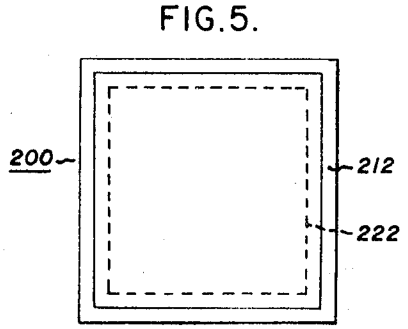
FIG. 5 is a bottom view of the gate controlled thyristor pellet.
Figure 6:
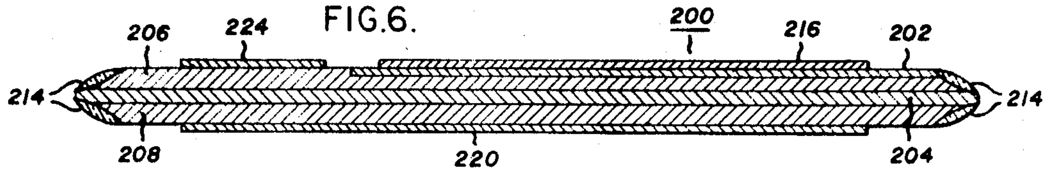
FIG. 6 is a section taken along line 6—6 in FIG. 4.

The semiconductive assembly 112 may be comprised of a thyristor semiconductive element 200 as illustrated in FIGS. 4, 5, and 6. The element 200 is comprised of first and third layers 202 and 204, respectively, of a first conductivity type and second and fourth layers 206 and 208, respectively, of an opposite conductivity type. The upper and lower edges of the element are beveled at 210 and 212, respectively. A dielectric passivation layer 214, such as glass, is adhered to the beveled edges. A first bonding assembly 216, schematically illustrated in FIG. 6, overlies the area 218 indicated by dahsed lines in FIG. 4. It is noted that the second layer extends through the first layer 202 in three circular areas 206A, 206B, and 206C to electrically connect the second layer to the first bonding assembly. A second bonding assembly 220 is adhered to the opposite face of the semiconductive element and occupies the area indicated by dahsed line 222 in FIG. 5. A gate bonding assembly 224 is adhered to the second layer over the area 226 designated by dashed lines in FIG. 4.

Figure 7:
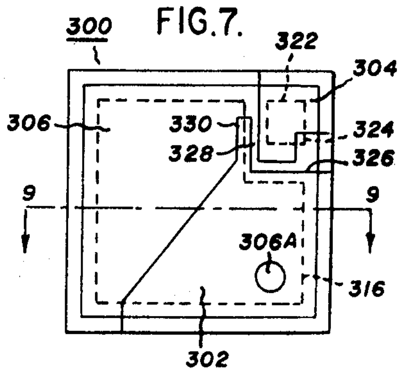
FIG. 7 is a plan view of a triac pellet.
Figure 8:
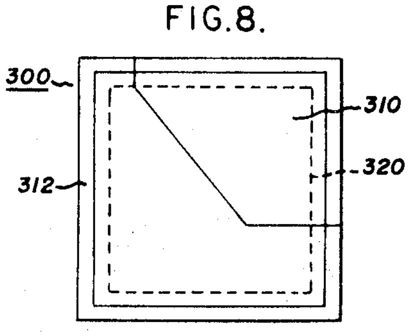
FIG. 8 is a bottom view of the triac pellet.
Figure 9:
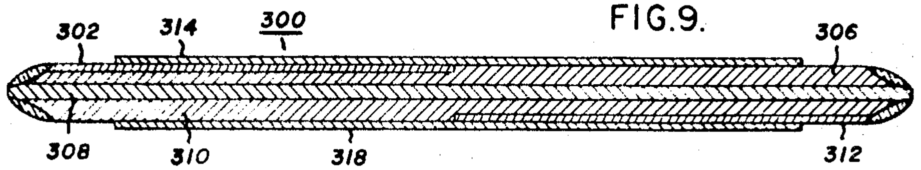
FIG. 9 is a section taken along line 9—9 in FIG. 7.

Alternately, the semiconductive assembly may be comprised of a triac semiconductive element 300 as illustrated in FIGS. 7, 8, and 9. The semiconductive element 300 is provided wih a first layer 302 and a gate layer 304 which are laterally spaced and of like conductivity type. Both the first and gate layers form junctions with a second layer 306 of opposite conductivity type. Layers 308 and 312 are of like conductivity type as layers 302 and 304 while fourth layer 310 is of like conductivity type as layer 306. It can thus be seen that in a section through the first layer area the semiconductive element may include a P-N-P-N or N-P-N-P sequence of layers, except for a small area 306A where the central layer 306 extends upwardly through the first layer 302 and only a three layer sequence is present. It can also be seen that a section through the gate layer 304 may include a P-N-P-N-P or N-P-N-P-N sequence of layers. A first bonding assembly 314 overlies the area defined by dashed lines 316 while a second bonding assembly 318 overlies the area defined by dashed lines 320. It is to be noted that both the first and second bonding assemblies overlie both P and N conductivity type regions. A gate bonding assembly, not shown, overlies the area 322 primarily overlying a portion of the gate layer 304. A small areal portion of the gate bonding assembly overlies an area 324, which is part of a somewhat larger area 326 of the layer 306. The surface interconnection of the area 326 to the main surface portion of the layer is through a thin and indirect connecting portion 328. It can be seen that the connecting portion 328 is thin because of the close spacing of the first and gate layers and because of a projecting finger portion 330 associated with the first layer. Since the layer 306 underlies both the first and gate layers the portion 326 is not dependent on the connecting portion 328 for electrical interconnection with the major portion of the layer 306, but rather this connecting portion serves primarily merely to electrically separate the gate and first layers.

The basic characteristics of thyristor and triac semiconductive elements has been widely discussed in numerous patents and publications including the SCR Manual, 4th Edition, published in 1967 by the General Electric Company. Accordingly, it is considered unnecessary to describe in detail the operative characteristics of the semiconductive elements 200 and 300 beyond noting the contribution of certain salient features. The beveled edges of the semiconductive elements serve to increase the potential level of reverse biasing that can be withstood by the devices without breakdown. More importantly, beveling offers the advantage of allowing non-destructive bulk breakdown to occur in preference to destructive surface breakdown. The glass edge passivation layer coacting with the beveled edges of the semiconductive elements adjacent the junctions serves to further enhance the reverse breakdown characteristics, as is more fully discussed by Davies et al. in copending patent application Ser. No. 255,037, filed Jan. 30, 1963, titled Semiconductive Devices with Increased Voltage Breakdown Characteristics, the disclosure of which is here incorporated by reference. Since many of the bonding assemblies overlie both P and N type regions, the preferred bonding assemblies described above are particularly advantageous, since this bonding assebly adheres well to both P and N type conductivity type regions. The areas 206A, 206B, and 206C in which the layer 206 is associated with the bonding assembly 216 directly provide a current flow path through the semiconductive element parallel to the gate and reduce the sensitivity of the semiconductive element to switching to the high conductivity mode in response to transient current or voltage pulses. The area 306A associated with the semiconductive element 300 performs a similar function. The contact area 324 between the gate bonding assembly and the second layer 306 allows a lower gate signal to switch the semiconductive element 300 to its high conductivity mode when the junction between the gate layer and layer 306 is reverse biased. The area 324 is positioned at a somewhat remote location from the main portion of the layer 306 to avoid bringing the entire layer 306 to the potential of the gate.

The glass passivation layers associated with the edges of semiconductive elements are preferably formed of a glass exhibiting a thermal expansion differential with respect to the semiconductive crystal of less than $5 \times 10^{-4}$. That is, if a unit length is measured along the surface of a semiconductive element with a layer of glass attached at or near the setting temperature of the glass and the semiconductive element and glass are thereafter reduced in temperature to the minimum ambient temperature to be encountered in use by a semiconductor device in which the semiconductive element is to be incorporated, the observed difference in the length of the glass layer as compared to the semiconductive element over the unit length originally measured at any temperature between and including the two extremes should be no more than $5 \times 10^{-4}$. It is appreciated that the thermal expansion differential so expressed is a dimensionless ratio of different in length per unit length. By maintaining the thermal expansion differential below $5 \times 10^{-4}$ (preferably below $1 \times 10^{-4}$), the thermal stresses transmitted to the glass by the semiconductive element are held to a minimum, thereby reducing the possibility of cleavage, fracture, or spawling of the glass due to immediately induced stresses or due to fatigue produced by thermal cycling.

Since the glass layer bridges at least one junction of the semiconductive element, it is important that the glass exhibit an insulative resistance of at least $10^{10}$ ohm-cm, so as to avoid shunting any significant leakage current around the junction to be passivated. To withstand the high field strengths likely to be developed across the junction during reverse bias, as is particularly characteristic of rectifiers, the glass layer is chosen to exhibit a dielectric strength of at least 100 volts/mil and preferably at least 500 volts/mil for high voltage recitifer uses. When the semiconductive element is peripherally beveled and provided with a glass passivation layer the semiconductive element is capable of withstanding reverse biasing at exceptionally high potential levels without being destroyed.

Two exemplary glasses that meet the preferred thermal expansion differential, dielectric strength, and insulative resistance characteristics discussed above and which are considered particularly suitable for use with silicon semiconductive elements are set out in Table I, percentages being indicated on a weight basis.

TABLE I

| Composition | No. 45 | No. 351 |
|---|---|---|
| $SiO_2$ | 12.35 | 9.4% |
| ZnO | 65.03 | 60.0 |
| $Al_2O_3$ | 0.06 | |
| $B_2O_3$ | 22.72 | 25.0 |
| $CeO_2$ | | 3.0 |
| $Bi_2O_3$ | | 0.1 |
| PbO | | 2.0 |
| $Sb_2O_3$ | | 0.5 |

Glass 351 is commercially available under the trade name "GE Glass 351" and Glass 45 is available under the trade name "Pyroceram 45." Other zinc-silicoborate glasses are available that meet the required physical characteristics. For example, the zinc-silicoborate glasses disclosed by Martin in U. S. Pat. No. 3,113,878, may be employed.

Figure 10:
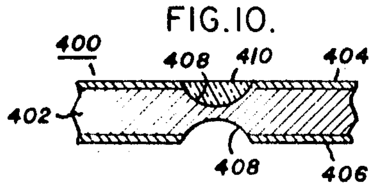
FIGS. 10 and 11 are sectional details of semiconductive wafers prior to pelletizing, prior to and subsequent to firing the glass passivation layers, respectively.
Figure 11:
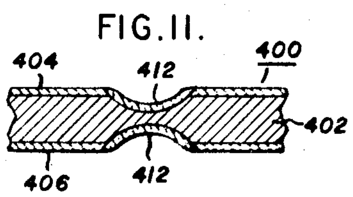

While a galss passivation layer applied to the junction of a semiconductive element offers a substantial degree of protection to chemical contamination of the junction tending to alter its electrical properties, it has been observed that it is frequently difficult to achieve the desired degree of passivation using a single glass layer. This may be better understood by reference to FIGS. 10 and 11, in which a semiconductive wafer 400 is shown intended to be sub-divided into a plurality of semiconductive elements. The wafer is typically formed of a central region 402 of a first conductivity type having planar diffused surface regions 404 and 406 of opposite conductivity type. The demarcation of separate semiconductive elements to be formed from the wafer is achieved by etching aligned grooves 408 on opposite faces of the wafer. The etched grooves also provide the edge beveling desired in the junction regions. The glass passivation layers are applied to opposite sides of the wafer sequentially. The grooves in the upper face of the wafer are filled with a finely divided glass frit, and the wafer is fired to the melting temperature of the frit. When the frit melts the glass forms a dense, substantially void-free layer 412. Since the voids are removed, the glass layer forms only a thin coating on the semiconductive element and does not occupy more than a minor portion of the groove, even through the groove was initially filled with frit. To form glass layers on the opposite side of the wafer, it is necessary to invert the wafer and repeat the process. If it is desired to thicken the glass layer it is necessary to repeatedly fill the grooves with glass frit and fire, but because of the large volume loss in firing it is not practical in most instances to completely fill the grooves with a dense glass layer. To divide the wafer into discrete pellets the wafer is broken apart along the grooves. This, of course, offers the risk of mechanically damaging the glass. While the process is set out for a three layer, two junction semiconductive element, it is appreicated that the same process is also widely used in the manufacture of two layer, single junction semiconductive elements, as well as four layer, three junction semiconductive elements.

To supplement the glass layers in protecting the semiconductive element from chemical contamination as well as to protect the glass layer and semiconductive element from stress and mechanical shock, the semiconductor device 100 is provided with a shield consisting of a pliant, substantially fluid impervious encapsulant 148 for the semiconductive element and glass layers associated therewith and a molded casement 150 that surrounds the encapsulant and cooperates with the heat sink, header, and electrical leads to form a housing for the device. While the pliant material is displaced by the glass layer from the highest field gradients, which occur at the peripheral junction regions, the pliant material is nevertheless subjected to substantial potential gradients and accordingly should exhibit a dielectric strength of 100 volts/mil and an insulation resistance of at least $10^{10}$ ohm-cm. Where the semiconductive device is to be used as a high voltage rectifier, it is preferred that the dielectric strength of the pliant material be at least 200 volts/mil. The pliant material may be chosen from a wide variety of suitable materials, including pliant synthetic resins, rubbers, and particulate dielectrics. An exemplary suitable particulate dielectric is disclosed by Fahey in U.S. Pat. No. 3,278,813. Exemplary suitable synthetic resins include fluorocarbon polymers, such as polytetrafluoroethylene, polychlorotrifluoroethylene, polyvinylidene fluoride, etc; polypropylene; high density polyethylene; polyethyleneterephthalate; diallyl phthalate; polyamides; etc. It is preferred to use a pliant, resilient, elastomeric material, such as silicone rubber. A preferred choice of pliant, substantially fluid impervious materials is disclosed in copending application Ser. No. 782,083, titled Semiconductor Device with Multiple Shock Absorbing and Passivation Layers, filed Dec. 9, 1968, the disclosure of which application is here incorporated by reference.

Figure 12:
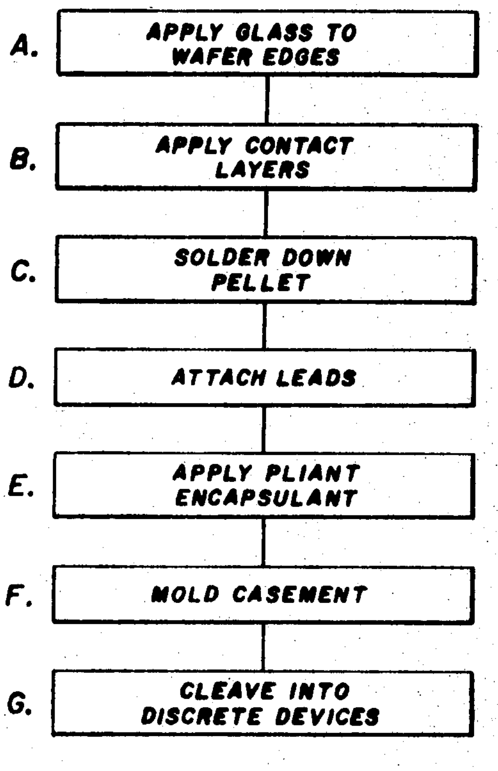
FIG. 12 is a schematic diagram of a preferred fabrication procedure.

The several advantages of the semiconductor device 100 over conventional molded casement semiconductor devices may be better appreciated by considering the process of forming the semiconductor device, which is schematically diagrammed in FIG. 12. Step A of the fabrication process calls for applying the glass passivation layers to the semiconductive crystalline material while it is still in the form of a wafer to be subdivided into pellets, as is described above with reference to FIGS. 10 and 11. After the glass passivation layers are applied to the semiconductive wafer, the various contact layers of the bonding assembly are applied, as indicated by Step B. According to a preferred technique the contact layers of chromium, tungsten, or molybdenum, oxide-free nickel, and silver are applied sequentially within a vapor plater at reduced pressure levels to reduce the opportunity for oxide contamination of the nickel layer. The layers may be applied sequentially without removing the wafer from the vapor plater or destroying the vacuum before plating is complete. In this way the preferred three contact layers may be laid down with practically the same degree of effort as vapor plating a single layer. It is, of course, anticipated that any conventional choice of contact layers may be alternately used and any known technique for their attachment to the semiconductive wafer employed. After the contact layers are applied, the semiconductive wafer may be sub-divided into a plurality of separate semiconductive elements or pellets by breaking the wafer along the etched grooves. Where the semiconductive wafer has not been previously etched, scribing may be employed to sub-divide the wafer into pellets.

The heat sinks are formed independently of the pellets by any conventional approach. Preferably the heat sinks with the foot portions attached are stamped out of flat metal stock with the foot portions being subsequently bent upwardly. As indicated by Step C each semiconductive element is bonded to a heat sink by soldering. This provides a low resistance electric connection between the heat sink and one terminal of the semiconductive element. At the same time, where a soft solder is employed, as is preferred, the solder acts as a shock absorbing layer between the heat sink and semiconductive element dampening shocks that would otherwise be transitted undiminished to the semiconductive element. At the same time that the semiconductive element is soldered to the heat sink the electrical connector 108 and gate connector may be soldered to the remote surface portion of the semiconductive element.

Attachment of the leads according to Step D is accomplished for the semiconductor device 100 by fitting the foot portion 132 of the heat sink into the window 138 of the header 136. The lead 142, which extends into the window of the header, then fits into the groover 134 of the foot portion. The lead 140 extends in tangential engagement with the outer surface of the flange portion 124 along its length, and the lead 144 extends in tangential engagement with the flange portion 126 of the gate connector. The header holds the leads in parallel relation. According to a preferred assembly procedure a unit of cold solder is placed in the window of the header and the leads 140 and 144 are then soldered to the mating flange portions. The heat generated in soldering these leads is transmitted through the heat sink and melts the unit of cold solder, thereby simultaneously soldering the lead 142 to the foot portion of the heat sink.

After the header is in place and the leads attached, a pliant, substantially fluid impervious material is positioned around the semiconductive element as indicated by Step E. The encapsulant is preferably applied in the form of a viscuous fluid capable of assuming the relationship to the heat sink and semiconductive element indicated in FIG. 2 by surface tension. The encapsulant may be cured in situ to a resilient, elastomeric form. It is preferred to utilize as an encapsulant a silicon rubber that is capacle of being valcanized at or near ambient conditions. Thus, after the encapsulant is applied, it may be cured merely by allowing the device to stand for a period of time before proceeding to the next process step, which is to mold the casement about the device. The molding Step F may be conveniently accomplished by injection molding. In order to allow alignment of a number of devices in an injection mold simultaneously the heat sinks may be provided with a connecting portion that can be cleaved as indicated at Step G to separate the devices for subsequent individual handling.

The advantages in the process for fabricating the device 100 as compared with conventional processes for fabricating molded casement semiconductor devices is that the semiconductive element is protected against mechanical shock, thermal stress, and chemical contamination throughout fabrication. It is to be noted that the device 100 is assembled with the leads already individually formed and rigidly mounted by the header. According to a conventional approach one or more leads may be initially attached to sheet stock and subsequently stamped out of engagement with the stock after soldering to the semiconductive element and molding the casement. Stamping of the leads from the heavy sheet stock allows mechanical shock to be transmitted to the semiconductive element and is particularly detrimental to the brittle glass passivation layers. In the present invention stamping of the leads after fabrication is eliminated and, further, the rigid header located within the casement protects against transmitting mechanical stress through the leads, as may occur in fitting mold members around the leads, for example. The round circular cross-section of the leads allows a more reliable, closer tolerance closing of the mold members around the leads. This eliminates excessive flash and obviates its removal by a separate operation after molding. Since round leads lack corners, no stress points are created at the intersection of the leads and the casement, as with rectangular leads. The round leads are, further, more desirable in making electrical connections in subsequent use of the devices. It is appreciated that while the invention may be practiced with round leads, leads of polygonal, ellipitical, or even irregular cross-section may be substituted, if desired, although all the advantages of the invention may not be retained.

Figure 13:
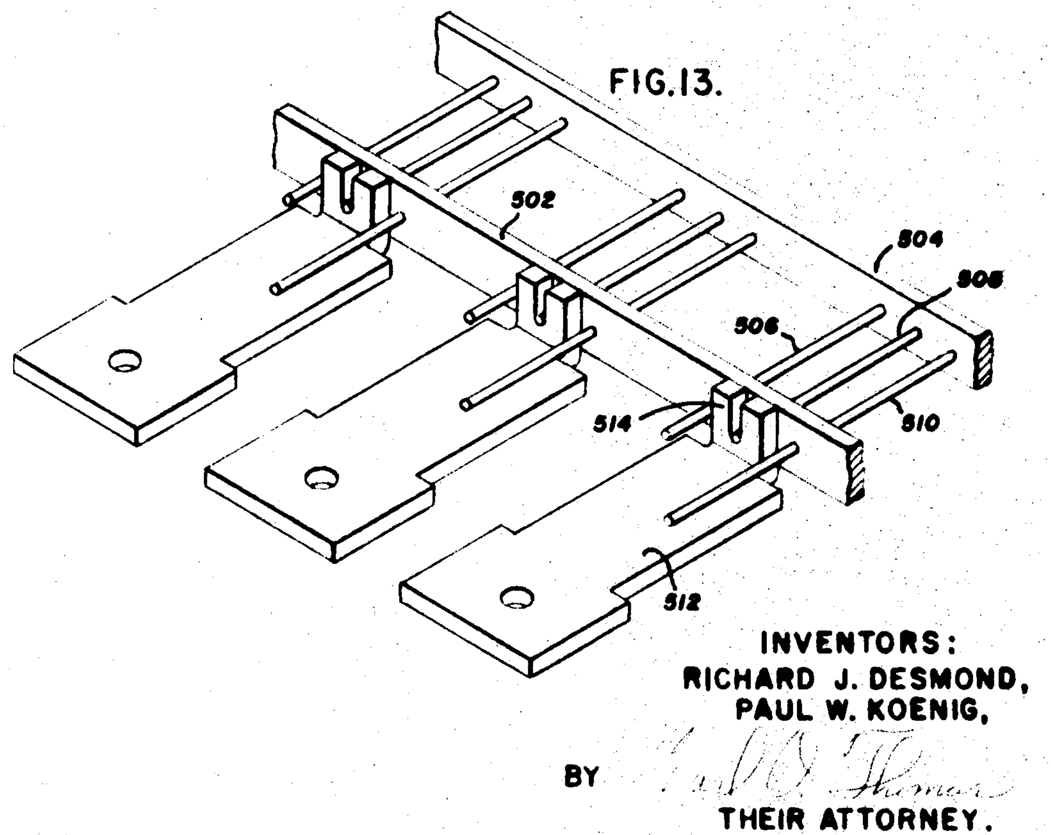
FIG. 13 is an isometric view of alternate header and heat sink combinations.

A variation on the header is disclosed in FIG. 13. The function of the header is performed by parallel strips 502 and 504 which removably mount a plurality of groups of leads in parallel relation. As shown, each lead group is formed of three parallel leads 506, 508, and 510. The central lead of each group fits into a groove of a foot portion 514 of each heat sink 512. This lead may be soldered or otherwise electrically connected to the foot portion in any desired manner. The leads 506 and 510 correspond to leads 144 and 140 of the semiconductor device 100. A semiconductive assembly and electrical connectors identical to those of device 100 may be used with the heat sink 512 and assembled according to the same procedure noted above. The advantage of the FIG. 13 arrangement is that the strips perform the function of the header 136 of the semiconductor device 100, but need not be incorporated in the completed device. That is, the strips hold the leads in rigid alignment preventing transmission of mechanical shocks to the associated semiconductive element. The molded casement that is subsequently formed, however, may be molded against the surface of the strip 502 in engagement with the foot portions. Accordingly, the strip 502 may be removed from the leads along with strip 504 after injection molding. If desired, the strips may be used repeatedly in the fabrication of semiconductor devices. In a modification, the casements may be molded around the strip 502. A plurality of devices will then be formed which are interconnected solely by the strips. The strip 504 can be removed in its entirety while the connecting portions of the strip 502 that project beyond the casement may be trimmed away to form discrete devices. In this form of the invention is is appreciated that the strip 502 may be advantageously located adjacent the inner surface of the foot portions rather than the outer surface as shown.

Figure 14:
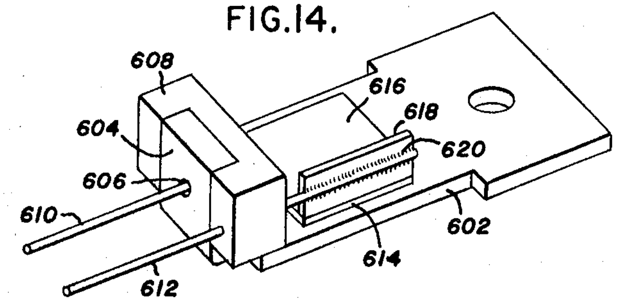
FIG. 14 is an isometric view of a modified semiconductor device at the stage of fabrication prior to shielding of the semiconductive pellet.

To further illustrate the invention another modification is illustrated in FIG. 14. A heat sink 602 is provided generally similar to heat sink 104, except that the foot portion 604 is provided with an aperture 606 instead of a groove, although a groove could be utilized. A header 608 rigidly mounts parallel electrical leads 610 and 612. The electrical lead 610 extends through the aperture 606 and is electrically connected to the heat sink by staking the foot portion. The shock transmitted to the heat sink in staking, however, need not damage the semiconductive element to be associated with the heat sink, since staking can be accomplished prior to soldering the semiconductive element to the heat sink. Also, even if staking occurs after the semiconductive assembly 614 is mounted, mechanical shock damage to the semiconductive element of the assembly is minimized by applying the mechanical shock to achieve staking at right angles to the main body of the heat sink. It is, of course, realized taht the lead 610 could also be soldered to the foot portion.

In the specific embodiment shown the electrical connector 616 covers the entire upper surface of the semiconductive assembly and is provided with an upstanding flange portion 618 along one entire edge. The electrical lead 612 is soldered to the flange portion at 620 extneding the length of the flange portion. In the preferred form of the invention the semiconductive assembly 614 is comprised of a single junction semiconductive element having bonding assemblies associated with its opposite major surfaces as described with reference to FIG. 3. The device shown in FIG. 14 when provided with a shield of pliant, substantially fluid impervious material and a molded casement is particuarly suitable for use as a high current rectifier because of the large contact areas with the semiconductive assembly. It is appreciated that the header arrangement 608 could be readily applied to the fabrication of a three lead semiconductor device, while the semiconductor devices shown and described elsewhere may be readily modified to form two lead semiconductor devices and, more particularly, high current rectifiers.

FIG. 15 illustrates still another header and heat sink combination. The heat sink 700 is provided with a pair of spaced, rectangular apertures 702 and 704 and a circular aperture 706 lying in an edge or foot portion 708 of the heat sink. The header 710 is provided with alignment tabs 712 and 714 that fit into the apertures 702 and 704, respectively. The header carries a central lead 716 that includes a portion 718 projecting from the header between the alignment tabs. The portion 718 mates with the central circular aperture 706 to provide an electrical connection between the heat sink and the central lead. When the header is positioned on the heat sink, the central lead may be positively connected to the heat sink by staking. Note, that no damage to the semiconductive element occurs from staking, since staking may be accomplished before the semiconductive element is mounted in place on the heat sink. Identical circular leads 718 are mounted on either side of the central lead in parallel relation. The header, being formed of an insulative material, acts to rigidly mount the leads in electrically isolated relation to the heat sink. Instead of providing rectangular apertures in the heat sink as shown, grooves may be cut into the heat sink from one edge to receive the alignment tabs. By utilizing the projecting lead portion 718 one or both of the alignment tabs may be eliminated, although this is not preferred. Instead of forming the central lead so that it is bent within the header, the central lead may pass through the header parallel to the remaining leads and be bent for insertion into an aperture in the heat sink at a point external of the header.

Having described the invention with reference to certain preferred embodiments, it is nevertheless apparent that numerous modifications will readily be suggested to those skilled in the art. It is accordingly intended that the scope of this invention be determined with reference to the following claims.

What we claim and desire to secure by Letters Patent of the United States is:

1. A process of fabricating a semiconductor device comprising associating with a mounting means a plurality of electrically isolated and spaced substantially parallel wire leads for the semiconductor device, mating an extending portion of at least one lead with a conforming surface of an upstanding portion of an electrically conductive heat sink, simultaneously providing a low impedance thermally fusible electrical interconnection between the mated lead and heat sink and thermally fusibly attaching semiconductor crystal means to the heat sink in electrically conductive relation therewith, attaching a connecting means between a surface of the semiconductor crystal means remote from the heat sink and one of the lead means isolated from the heat sink, placing a pliant, substantially fluid impervious electrically insulative plastic material about the semiconductor crystal means, molding a relative stiff casement about the semiconductor means, heat sink, and lead means, and separating at least a portion of the mounting means from the lead means.

2. A process of simultaneously fabricating a plurality of separate multiple lead semiconductor devices comprising rigidly mounting in parallel relation spaced groups of lead means, each group of parallel lead means being intended for association in a separate semiconductor device, mating an extending portion of at least one lead means within each group with a conforming surface of an upstanding portion of an electrically conductive heat sink means, simultaneously providing a low impedance electrical interconnection of the mated lead means and heat sink means and attaching semiconductor crystal means to the heat sink means for each device in electrically conductive relation therewith, attaching connection means between a surface of each semiconductor crystal means remote from the heat sink means and one of the lead means within each group isolated from the heat sink means, placing a pliant, substantially fluid impervious material about each semiconductor crystal means, molding a casement about each semiconductor crystal means, associated heat sink means, and lead means group, and removing the physical interconnection between separate semiconductor devices.

* * * * *